United States Patent

Gerner

[11] Patent Number: 5,898,192
[45] Date of Patent: Apr. 27, 1999

[54] LIGHT EMITTING DIODE WITH IMPROVED LUMINOUS EFFICIENCY HAVING A CONTACT STRUCTURE DISPOSED ON A FROSTED OUTER SURFACE

[75] Inventor: Jochen Gerner, Wiesloch, Germany

[73] Assignee: Temic Telefunken microelectronic GmbH, Heilbronn, Germany

[21] Appl. No.: 08/703,853

[22] Filed: Aug. 27, 1996

[30] Foreign Application Priority Data

Oct. 9, 1995 [DE] Germany ............... 195 37 544

[51] Int. Cl.[6] ................................................. H01L 33/00
[52] U.S. Cl. ........................... 257/98; 257/81; 257/91; 257/99
[58] Field of Search .................... 257/98, 81, 86, 257/91, 99

[56] References Cited

U.S. PATENT DOCUMENTS

| 3,537,028 | 10/1970 | Pankove ........................... 257/98 |
| 5,132,751 | 7/1992 | Shibata et al. ..................... 257/93 |
| 5,162,878 | 11/1992 | Sasagawa et al. ................. 257/98 |

FOREIGN PATENT DOCUMENTS

| 0035118 | 9/1981 | European Pat. Off. . |
| 0404565 | 12/1990 | European Pat. Off. . |
| OS 30 974 | 1/1971 | Germany . |
| 24 60 831 A1 | 7/1975 | Germany . |
| 2460831 | 7/1975 | Germany . |
| 2719567 | 12/1977 | Germany . |
| 32 00 788 A1 | 7/1982 | Germany . |
| 3200788 | 7/1982 | Germany . |
| 4231007 | 3/1994 | Germany . |
| 55-43883 | 3/1980 | Japan ........................... 257/98 |
| 62-54485 | 3/1987 | Japan ........................... 257/98 |

OTHER PUBLICATIONS

O. Aina et al.: "Microstructure and Resistivity of Laser–Annealed Au–Ge Ohmic Contacts on GaAs". In: J. Electrochem. Soc.: Solid–State Science and Technology, Oct. 1981, vol. 128, No. 10, pp. 2183–2187.

L.R. Zheng et al.: "Shallow ohmic contacts to n–type GaAs and $Al_xGa_{1-x}As$". In: Appl. Phys. Lett. 60 (7), Feb. 17, 1992, pp. 877–879.

Masato Yamashita et al.: "Barrier metal against Ga and Zn out–diffusion in p–GaP/Au:Zn contact system". In: J. Appln. Phys. 52 (12), Dec. 1981, pp. 7304–7308.

Primary Examiner—Jerome Jackson
Assistant Examiner—Nathan Kelley
Attorney, Agent, or Firm—Spencer & Frank

[57] ABSTRACT

A light emitting diode for generating preferably green light with improved luminous efficiency. A number of epitaxial layers suitable for the light emission is arranged on a doped semiconductor substrate wafer of GaP. The surface of the epitaxial layers is completely frosted. The light emission from the interior is considerably improved by the frosting. A contact layer structure is placed on the frosted surface for contacting the light emitting diode. The contact layer consists of several partial layers and covers at least a part the frosted surface. There is also a contact layer at the rear of the light emitting diode.

11 Claims, 3 Drawing Sheets

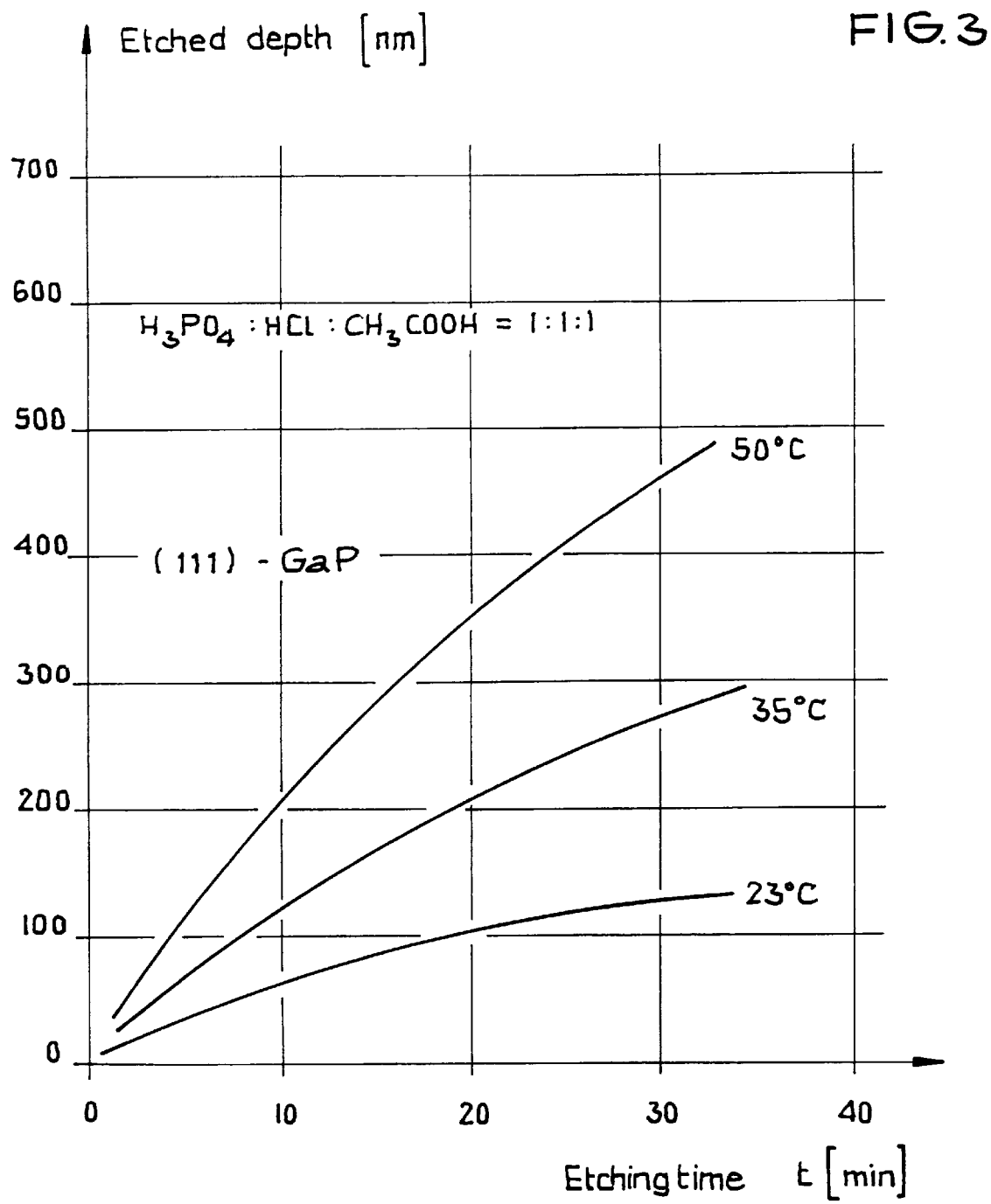

LIGHT EMITTING DIODE WITH IMPROVED LUMINOUS EFFICIENCY HAVING A CONTACT STRUCTURE DISPOSED ON A FROSTED OUTER SURFACE

BACKGROUND OF THE INVENTION

The invention relates to a light emitting diode with a frosted surface. Green luminous light emitting diodes are made from (1 1 1)-oriented gallium phosphide. Since gallium phosphide is an indirect semiconductor, the efficiency is lower than in mixed crystal systems where, with a suitable composition, direct band-to-band transitions are also possible. The external quantum efficiency, which is determined by the material property of internal quantum efficiency and by the losses which occur when the radiation emerges from within the diode, is no more than 0.3% for GaP diodes.

One reason for the poor efficiency of the diodes is the proportion of radiation that cannot escape from the body of the diode because of the total reflection on the surface of the semiconductor. This is due to the high optical refractive index of the semiconductor material. This is approximately 3.4 for gallium phosphide. This results in a critical angle of total reflection of 17.7° on emergence of the radiation to air. By direct means, only that proportion of the radiation is emitted that falls on the boundary layer at a smaller angle to the surface normal. The remainder is reflected back into the diode body. A large part of the radiation reflected back is lost due to absorption in the semiconductor body and at the metal contacts. The efficiency can therefore be increased considerably if the emission of the radiation is improved.

In principle, there are many means of improving radiation emission from the interior. In the patent publication DE 42 31 007 A1, a method is described for increasing the critical angle of total reflection by applying a $\lambda/4$-thick antireflective coating.

From EP 404 565, a radiation-emitting diode made from the III–V compound-semiconductor material GaAlAs is known where the entire surface of the semiconductor chip is roughened in order to improve the external quantum efficiency. The roughening or frosting takes place after the diodes have been singled out. By frosting, the total reflection of the radiation generated at the boundary layer between the diode chip and the surrounding material is largely avoided, the light path in the semiconductor material is shortened and thus the probability of reabsorption is reduced. At the same time, the effective surface of the diode is increased in size thereby allowing more radiation to escape from the inside of the diode. A disadvantage of such a frosted surface, however, is that the diode chip is very difficult to bond at the time of assembly because of the etched contact layer structures. Etch-resistant materials must be used for the contact layer structures. Furthermore, etching of the surface in the region of the radiation-emitting junction results in a reduction of the life of the diodes.

SUMMARY OF THE INVENTION

The object of the invention is to increase the efficiency of a light emitting diode of the type mentioned at the outset by improving the degree of emission of the radiation generated in the diode while avoiding the disadvantages mentioned. The light emitting diode in accordance with the invention consists of a semiconductor substrate with a succession of epitaxial layers arranged on it and suitable for light emission and on whose surface there is at least in part a contact layer structure. The surface of the epitaxial layers is completely frosted in order to increase the luminous efficiency. The contact layer structure is situated on the frosted surface.

The advantages associated with the invention are in particular that the front-side contact is placed on the light emitting diode surface that is already frosted. The front-side contact can be made on the frosted surface of the semiconductor wafer without providing any disadvantages in terms of the function of the diode. This allows low etch-resistant metals such as aluminum to be used for the contact layer structures.

The semiconductor substrate of the light emitting diode is made of doped gallium phosphide and has (1 1 1) crystal orientation.

The epitaxial layers consist of an n-conductive layer of GaP on the semiconductor substrate and a p-conductive layer of GaP on the n-conductive layer. The light emitting diode preferably emits green light.

The roughness depth of the frosted surface is below 1 $\mu$m. It is therefore easily possible to bond the contact layers provided on the frosted surface to the connection on housing parts.

BRIEF DESCRIPTION OF THE DRAWINGS

FIG. 3 shows the relationship between etched depth and the etching time at different temperatures for the etching solution according to the invention;

DESCRIPTION OF THE PREFERRED EMBODIMENTS

An embodiment example of the invention will now be described with reference to the figures.

Figure 1:
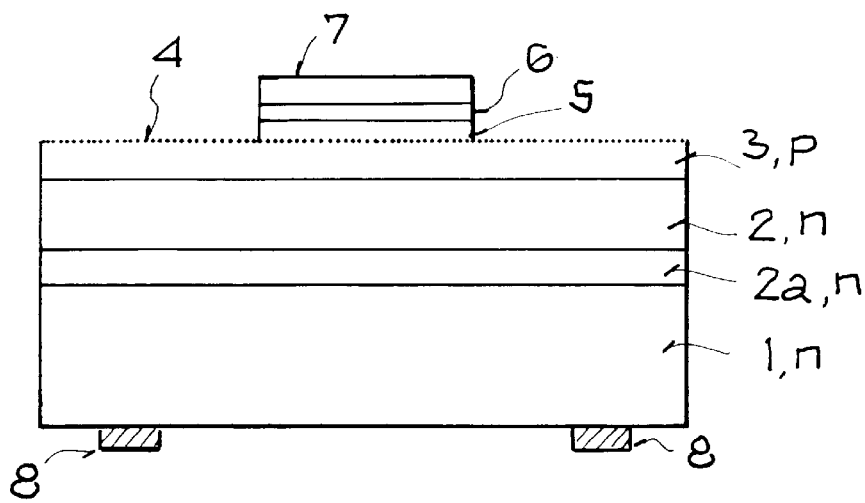
FIG. 1 shows a cross-sectional view of a light emitting diode according to the invention.

The light emitting diode shown in FIG. 1 consists of a semiconductor substrate 1 of (1 1 1)-oriented gallium phosphide (GaP). On the n-conducting GaP substrate 1, which is doped for example with tellurium or sulfur, a GaP layer that is also n-conducting is epitaxially applied as first epitaxial layer 2. Like the substrate, the first epitaxial layer 2 is doped with tellurium or sulfur. The concentrations of the doping materials in the substrate material are advantageously in the region of $2\text{--}6\cdot10^{17}$ cm$^{-3}$ and in the first epitaxial layer 2 advantageously in the region of $1\cdot10^{16}$ cm$^{-3}$. Both vapor-phase (VPE) and liquid-phase (LPE) epitaxy methods can be used to produce the epitaxial layers. These days, however, the liquid-phase epitaxy method (LPE) is almost always used. A p-conductive second epitaxial layer 3 of GaP, preferably doped with zinc, is applied on the first epitaxial layer 2, and in this example embodiment forms the p-conductive side of the light emitting diode. The concentration of the doping material in the second epitaxial layer 3 is advantageously in the region of $2\cdot10^{18}$ cm$^{-3}$.

Diodes with an n-conductive buffer layer 2a placed between the substrate 1 and the first epitaxial layer 2 achieve an even higher efficiency. In the embodiment example, the buffer layer 2a is preferably doped with sulfur, where the concentration of the doping material is in the region of approx. $5 \cdot 10^{16}$ cm$^{-3}$.

For light emitting diodes emitting a yellow-green light, the epitaxial layers 2 and 3 in the proximity of the pn junction are additionally doped with nitrogen in order to produce isoelectronic centers and thus to increase the transition probability for the radiating recombination and at the same time to accomplish a shift in the emission wavelength. The nitrogen concentration should be in the region of $1 \cdot 10^{19}$ cm$^{-3}$.

The entire outer major surface 4 of the p-conductive epitaxial layer 3 is frosted in order to improve the light emission from the interior. The roughness depth of the frosted surface must not be greater than the upper value of 1 μm in order for the diodes to be bondable and not to be damaged at the time of assembly.

On the frosted surface there is a contact layer arrangement 5, 6, 7. With the semiconductor beneath it, this forms an ohmic contact. The contact layer arrangement 5, 6, 7 comprises several contact layers. In the embodiment example, the first contact layer 5 is made of gold-zinc or gold-beryllium. A second contact layer 6 is arranged on it. This acts as diffusion barrier and is made of titanium-tungsten-nitride. On the diffusion barrier, there is a third contact layer 7 made of aluminum. The aluminum layer 7 reinforces the first contact layer 5 and permits good bonding of the diode when assembled at a later time.

Instead of the combination of second contact layer 6 made of titanium-tungsten-nitride and third contact layer 7 made of aluminum, just a single contact layer made of gold can be arranged on the first contact layer 5.

The third contact layer 7 can be made of an AlSi alloy instead of aluminum. AlSi alloys are more resistant to corrosion than pure aluminum.

The metallization on the n-conductive semiconductor surface of the reverse side of the wafer is preferably in the form of a gold-germanium layer 8. The reverse side of the diode is advantageously, though not necessarily, only partially metallized.

FIGS. 2a to 2d show a cross-section through the light emitting diode following essential stages in its manufacturing process. First of all, the first and second epitaxial GaP layers 2, 3 are produced on a substrate wafer 1 made of (1 1 1)-oriented gallium phosphide. Either gas-phase or liquid-phase epitaxial processes can be applied to produce the epitaxial layers. At the present time, however, the liquid-phase epitaxial process is used with almost no exception. The two epitaxial layers 2, 3 contain/form the radiation-emitting pn junction.

Figure 2A:
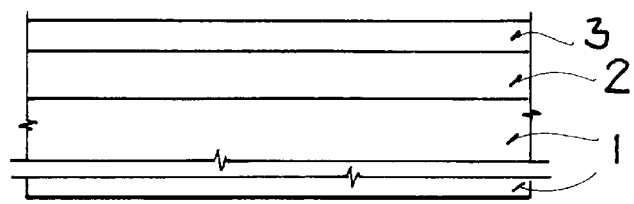
FIG. 2a shows the light emitting diode of FIG. 1 in a first stage of its manufacture.

FIG. 2a shows the substrate wafer 1 with the two epitaxial layers 2, 3 after this stage in the manufacturing process. The epitaxial layers are doped from the melt during the growth stage.

In the following stage of the process, the surface 4 is frosted before deposition of the contact layers. It is therefore possible to use less etch-resistant metals, such as aluminum for example, for the contact layers.

Figure 2B:
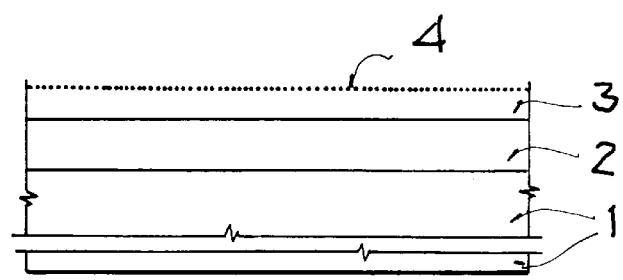
FIG. 2b shows the light emitting diode of FIG. 1 in a second stage of its manufacture.

The frosting process is designed such that it can be performed without any particular measures at a relatively low temperature under normal laboratory conditions. The etchant used is a mixture of $H_3PO_4$, HCl and $CH_3COOH$ in equal volumetric amounts. A fine frosted surface 4 is produced with a roughness depth of less than 1 μm. FIG. 2b shows the semiconductor wafer at the end of this stage in the process.

Figure 2C:
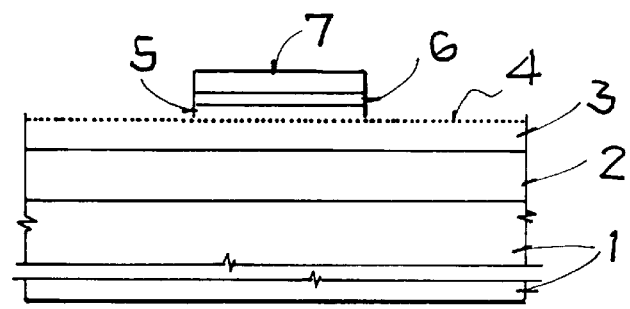
FIG. 2c shows the light emitting diode of FIG. 1 in a third stage of its manufacture.

The semiconductor wafer is now provided with a first contact layer 5 of gold-zinc on the frosted surface 4 of the p-conductive wafer side in specified partial areas. Since, when the diode is later assembled, the contact layer is joined with the help of a bonding process to a terminal pin on the housing through one or several thin bonding wires of gold or aluminum, and since damage to the contact layer and the semiconductor crystal must be avoided while the wire is being bonded, the first contact layer 5 is reinforced by one or several other contact layers 6, 7. In general, aluminum is preferred to gold as reinforcing layer because it makes assembly easier. Between the first contact layer 5 of gold-zinc and the third contact layer 7 of aluminum provided for the purposes of reinforcement, a second contact layer 6, made preferably of titanium-tungsten-nitride, is provided as diffusion barrier that prevents the gold-zinc layer (first contact layer 5) and the aluminum reinforcement (third contact layer 7) from becoming alloyed while the contact layer arrangement is being tempered. The arrangement after this stage of the process is shown in FIG. 2c. Instead of aluminum, an AlSi alloy can also be used as material for the third contact layer 7. AlSi alloys are more resistant to corrosion than pure aluminum.

Figure 2D:
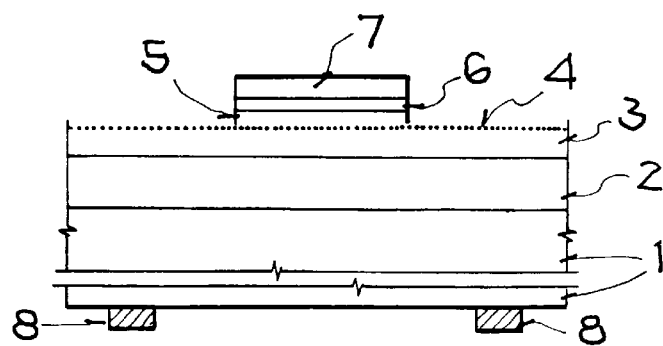
FIG. 2d shows the light emitting diode of FIG. 1 in a fourth stage of its manufacture.

In the next and final stage of the wafer process, the n-conductive wafer reverse side is provided with a metallization (8). This metallization can be performed over the whole surface, but it is preferably performed only partially and is, for example, of gold-germanium. After deposition and structuring of the contact layers on the front and reverse sides, the contacts are tempered in a temperature process in order to obtain the ohmic properties. The arrangement after this stage of the process is shown in FIG. 2d.

The diodes are then separated by dividing up the semiconductor wafer and assembled appropriately.

The graph in FIG. 3 shows the relationship between etched depth and the etching time at different temperatures for the etching solution, which consists of a mixture of phosphoric acid, hydrochloric acid and acetic acid, and for a (1 1 1) B GaP surface. These acids have a volumetric ratio of 1:1:1. In a series of experiments using mixtures of phosphoric acid and hydrochloric acid, it has been found that with (1 1 1) B GaP, surface roughnesses comparable to those achieved with nearly boiling concentrated hydrochloric or hydrofluoric acid can be obtained even at temperatures slightly over room temperature. However, owing to the high viscosity of the phosphoric acid and the low process temperature, no disturbing chloric acid or fluoric acid vapors are produced. When viewed with great magnification, it can be seen that both those surfaces treated with hydrochloric or hydrofluoric acid and those treated with the mixture of phosphoric acid and hydrochloric acid are covered with pyramids that are regular and adjacent without gaps and which all end with a sharp peak. By adding acetic acid to the mixture of phosphoric acid and hydrochloric acid, the development of these sharp-pointed pyramids can be prevented and the desired fine frosted surface with a roughness depth of less than 1 μm results instead. As the graph in FIG. 3 shows, the amount of material removed by the etching solution is little. Even at a temperature of 50° C. and an etching time of 30 minutes, the mean depth of removal is only in the region of 500 nm. The low rate of dissolution is an indication of the existence of inhibition phenomena when etching takes place. Since the depth of etching is also proportional to the square root of the etching time, it can be concluded that at least some part of the etching reaction is diffusion-controlled. It is presumably the rate at which reactant products can be removed that limits the etching rate.

Figure 4:
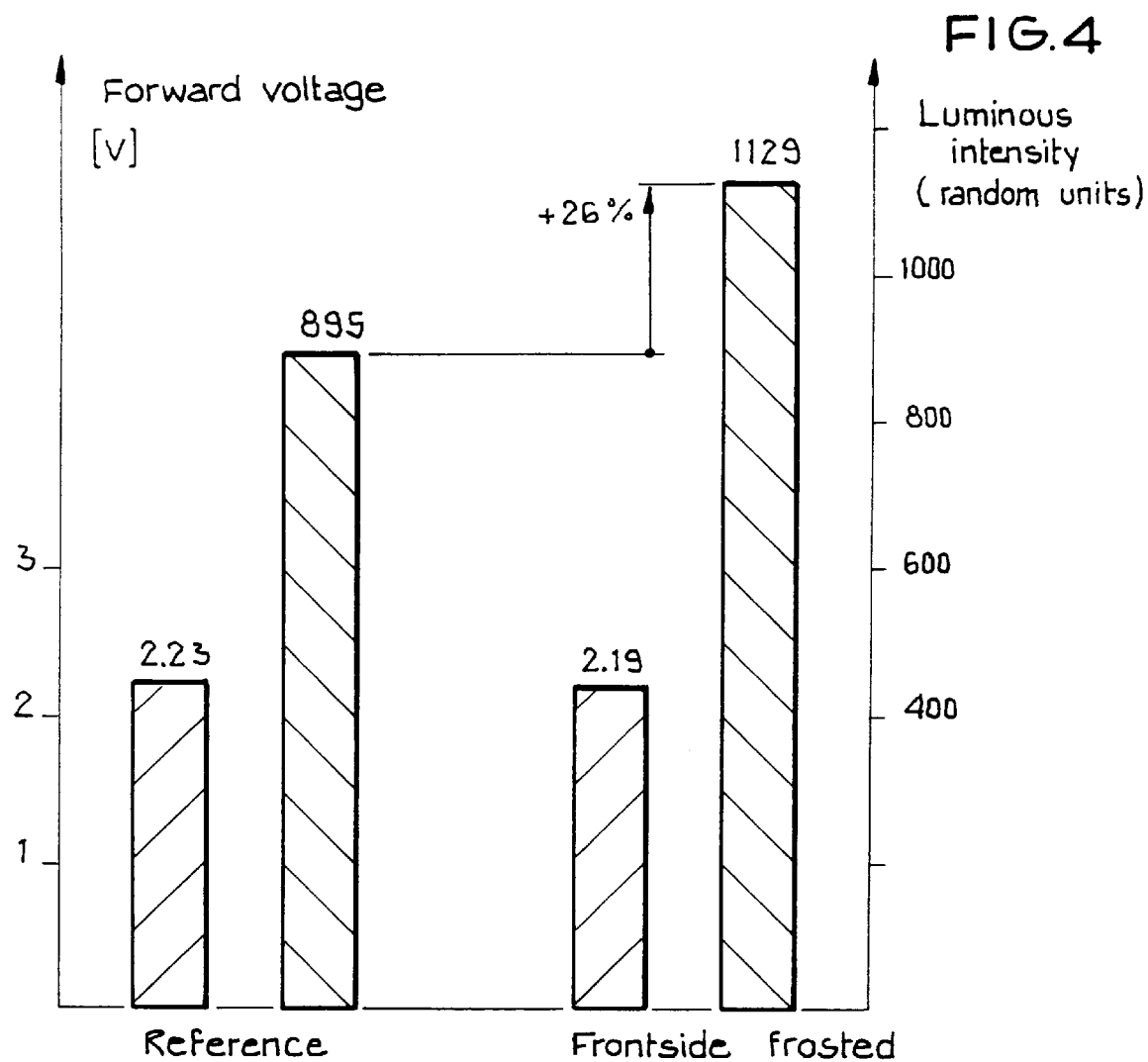
FIG. 4 shows the forward voltage and the luminous intensity of a yellow-green emitting nitrogen-doped GaP chip for diodes with frosted surface as compared with conventional diodes.

By frosting the front side of the semiconductor substrate wafer, the external quantum efficiency can be improved by about 25%. This can be seen in the chart in FIG. 4 which shows the forward voltage and luminous intensity data for a conventional GaP:N light emitting diode chip for the green spectral range compared with the data for a chip with frosted front side. The luminous intensity with a forward current of 20 mA could be improved by 26% from 895 to 1129 (random units). At the same time, the forward voltage dropped from 2.23 V to 2.19 V. Tests have also shown that the life of the diodes with frosted front side is not adversely affected as compared with conventional diodes.

By means of the method described above for frosting the front side of light emitting diodes, it is possible to increase the luminous efficiency by about 25%. Since the frost-etching process is performed before the contacting of the front side, this method can also be applied if aluminum is to be used as contact material. Since the frosting is still restricted to the front side of the diodes and the electrically active pn junction emerges to the surface at the lateral areas, the life of the diodes is not adversely affected by the method.

What is claimed is:

1. Light emitting diode comprising a number of epitaxial layers suitable for light emission arranged on a semiconductor substrate, and a contact layer structure disposed on at least a part of the outer major surface of the epitaxial layers, and wherein:

the outer major surface of the epitaxial layers is completely frosted in order to increase the luminous efficiency, the contact layer structure is arranged on the frosted surface, and the roughness depth of the frosted surface is below 1 um.

2. Light emitting diode in accordance with claim 1, wherein the semiconductor substrate is made of doped gallium phosphide.

3. Light emitting diode in accordance with claim 2, wherein the doped gallium phosphide of the semiconductor substrate has (1 1 1) crystal orientation.

4. Light emitting diode in accordance with claim 3, wherein the epitaxial layers consist of an n-conductive layer of GaP arranged on the semiconductor substrate and a p-conductive layer of GaP arranged on the n-conductive layer.

5. Light emitting diode in accordance with claim 1, wherein the contact layer structure arranged on the frosted surface consists, in the sequence given, of a first contact layer of gold-zinc, a second contact layer of titanium-tungsten-nitride, and a third contact layer of aluminum.

6. Light emitting diode in accordance with claim 1, wherein the contact layer structure arranged on the frosted surface consists, in the sequence given, of a first contact layer of gold-zinc, a second contact layer of titanium-tungsten-nitride, and a third contact layer of aluminum-silicon.

7. Light emitting diode in accordance with claim 1, wherein the outer surface opposite to the frosted surface of the substrate is provided with a further contact layer made of a gold-germanium alloy.

8. Light emitting diode in accordance with claim 4, wherein the contact layer structure arranged on the frosted surface consists, in the sequence given, of a first contact layer of gold-zinc, a second contact layer of titanium-tungsten-nitride, and a third contact layer of aluminum.

9. Light emitting diode in accordance with claim 5, wherein the epitaxial layers consist of an n-conductive layer of GaP arranged on the semiconductor substrate and a p-conductive layer of GaP arranged on the n-conductive layer.

10. Light emitting diode in accordance with claim 4, wherein the contact layer structure arranged on the frosted surface consists, in the sequence given, of a first contact layer of gold-zinc, a second contact layer of titanium-tungsten-nitride, and a third contact layer of aluminum-silicon.

11. Light emitting diode in accordance with claim 6, wherein the epitaxial layers consist of an n-conductive layer of GaP arranged on the semiconductor substrate and a p-conductive layer of GaP arranged on the n-conductive layer.

* * * * *